US007713682B2

(12) United States Patent
Chen (10) Patent No.: US 7,713,682 B2
(45) Date of Patent: May 11, 2010

(54) SUBSTRATE, METHOD OF EXPOSING A SUBSTRATE, MACHINE READABLE MEDIUM

(75) Inventor: Alek Chi-Heng Chen, Xindian (TW)

(73) Assignee: ASML Netherlands B.V., Veldhoven (NL)

( * ) Notice: Subject to any disclaimer, the term of this patent is extended or adjusted under 35 U.S.C. 154(b) by 799 days.

(21) Appl. No.: 11/526,244

(22) Filed: Sep. 25, 2006

(65) Prior Publication Data
US 2007/0072097 A1  Mar. 29, 2007

Related U.S. Application Data

(63) Continuation-in-part of application No. 11/234,399, filed on Sep. 26, 2005.

(51) Int. Cl.
*G03F 7/26* (2006.01)
(52) U.S. Cl. ........................................ 430/322; 430/394
(58) Field of Classification Search ................. 430/322, 430/394, 316, 317, 312
See application file for complete search history.

(56) References Cited

U.S. PATENT DOCUMENTS

| 5,716,758 | A | 2/1998 | Bae et al. |
| 6,042,998 | A | 3/2000 | Brueck et al. |
| 6,107,006 | A | 8/2000 | Chang |
| 6,489,713 | B1 | 7/2003 | Okoroanyanwu |
| 6,589,713 | B1 | 7/2003 | Okoroanyanwu |
| 7,582,413 | B2 * | 9/2009 | Chen .......................... 430/322 |
| 2004/0009434 | A1 | 1/2004 | Lin et al. |
| 2004/0180297 | A1 | 9/2004 | Yoon et al. |
| 2004/0197676 | A1 | 10/2004 | Rau |
| 2005/0025541 | A1 | 2/2005 | Terae et al. |
| 2007/0072133 | A1 | 3/2007 | Chen |

FOREIGN PATENT DOCUMENTS

JP  1-191130 A  8/1989

(Continued)

OTHER PUBLICATIONS

Japanese Office Action issued for Patent Application No. 2006-257086, dated Mar. 2, 2007.

(Continued)

*Primary Examiner*—Kathleen Duda
*Assistant Examiner*—Caleen O Sullivan
(74) *Attorney, Agent, or Firm*—Sterne, Kessler, Goldstein & Fox P.L.L.C.

(57) ABSTRACT

A multiple exposure method for enhancing the image resolution in a lithographic system is disclosed. The method comprises, for example, decomposing a desired pattern to be printed on the substrate into at least two constituent sub-patterns that are capable of being optically resolved by the lithographic system, coating the substrate with a positive tone resist layer and a relatively thin positive tone developable material layer on top of a target layer which is to be patterned with the desired dense feature pattern. The positive tone developable material absorbs exposure radiation during a first patterning exposure and, after development, during a second patterning exposure to prevent exposure of at least a portion of the positive tone resist layer, underneath exposed portions of the positive tone developable material layer, to an exposure dose above a fraction of an energy-to-clear exposure dose associated with the positive tone resist layer.

8 Claims, 8 Drawing Sheets

FOREIGN PATENT DOCUMENTS

| | | |
|---|---|---|
| JP | 02-079045 | 3/1990 |
| JP | 05-275316 | 10/1993 |
| JP | 2000-194141 A | 7/2000 |
| JP | 2001-33984 A | 2/2001 |
| JP | 2002-075857 | 3/2002 |
| JP | 2003-233197 A | 8/2003 |
| JP | 2007-235485 A | 9/2007 |
| WO | WO 2005/015312 A2 | 2/2005 |

OTHER PUBLICATIONS

European Search Report for Appln. No. EP 06 25 4878 mailed Jul. 18, 2008, 4 pgs.

Lin, "Portable Conformable Mask. OA Hybrid Near-Ultraviolet and Deep-Ultraviolet Patterning Technique," Selected Papers on Optical Microlithography, Bellingham, Jan. 1, 1992, pp. 18-24.

Lin et al., "Portable Conformable mask-a hybrid near-ultraviolet and deep-ultraviolet patterning technique", Developments in Semiconductor Microlithography, proceedings of the SPIE, 1979, vol. 174, pp. 114-121.

English Abstract for JP 1-191130 A published Aug. 1, 1989, 2 pgs.

English Abstract for JP 2000-194141 A published Jul. 14, 2000, 1 pg.

English Abstract for JP 2001-033984 A published Feb. 9, 2001, 2 pgs.

English Abstract for JP 2003-233197 A published Aug. 22, 2003, 1 pg.

English Abstract for JP 2007-235485 A published Sep. 13, 2007, 1 pg.

* cited by examiner

SUBSTRATE, METHOD OF EXPOSING A SUBSTRATE, MACHINE READABLE MEDIUM

This application is a continuation-in-part application of co-pending U.S. patent application Ser. No. 11/234,399, filed Sep. 26, 2005, the entire contents of which is hereby incorporated by reference.

FIELD

The invention generally relates to photolithography and associated methods and apparatus for exposing semiconductor substrates. In particular the invention relates to a method of forming a pattern of dense features on a substrate.

BACKGROUND

Lithographic exposure apparatuses can be used, for example, in the manufacture of integrated circuits (ICs). In such a case, a patterning device may generate a circuit pattern corresponding to an individual layer of the IC. In photolithography, a beam of radiation is patterned by having that beam traverse the patterning device, and is projected by a projection system of the lithographic apparatus onto a target portion (e.g., comprising one or more dies) on a substrate (e.g., silicon wafer) that has been coated with a layer of photo-activated resist (i.e., photoresist) material, such as to image the desired pattern in the resist. In general, a single substrate will contain a whole network of adjacent target portions that are successively irradiated via the projection system, one at a time.

In the semiconductor industry, the continual demand for smaller semiconductor devices, having smaller patterns and features on the substrate, is pushing the limits on the optical resolution that can be achieved by lithographic exposure apparatus. Generally, the smallest size of a repeatable feature (e.g., "half-pitch") of a pattern exposed on the substrate that can be optically resolved by lithographic exposure apparatus, depends on attributes of the projection system and the (patterned) projection beam of radiation. In particular, the optical resolution for half-pitch feature size may be derived by using the simplified form of the Rayleigh resolution equation:

$$p_{0.5} = k_1 \cdot \lambda/NA, \text{ with } k_1 \geq 0.25 \quad (1)$$

where $p_{0.5}$ represents the repeatable feature size (e.g., "half-pitch") in nm, NA represents the numerical aperture of the projection system, $\lambda$ represents the wavelength of the projection beam, in nm, and $k_1$ is a factor representative for the achievable optical resolution limit for the half-pitch feature size.

As indicated above, the theoretical optical resolution half-pitch lower limit for $k_1$ is 0.25. In an attempt to approach the $k_1=0.25$ barrier, considerable efforts have been directed to develop expensive technologies that are capable of employing shorter wavelengths and/or higher numerical apertures, thus allowing production of smaller features while not violating the $k_1 \geq 0.25$ constraint. However, these technologies do not enable a circumvention of the $k_1=0.25$ barrier to arrive at effective values of the $k_1$ such that $k_1 < 0.25$.

For printing a pattern of dense lines and spaces (i.e., providing lines of hard mask material that serve as etch stop and which protrude from a surface of a target layer to be etched, with spaces in between) where the lines occur at a pitch p, it is known that circumvention of the $k_1=0.25$ barrier is possible by applying a multiple exposure lithographic process, wherein a desired pattern of dense lines and spaces to be printed is decomposed into two constituent sub-patterns of trenches (arranged at a pitch 2p) that are capable of being optically resolved by the lithographic system. A Si substrate is coated with a $SiO_2$ film serving as a hard mask, and the $SiO_2$ film is coated with a negative tone photoresist layer. By exposure to an image where trenches appear as dark lines arranged at a pitch 2p on a bright background, and a subsequent development of the resist material, a first resist mask comprising trenches at a pitch 2p is provided on the $SiO_2$ film. By a subsequent etching of the $SiO_2$ film and a stripping of the resist, the first sub pattern of trenches is transferred to the $SiO_2$ film. Next, the process of applying negative tone resist material, exposing, developing and etching is repeated with a second sub-pattern of trenches, which may correspond to the first sub-pattern of trenches off-set by a half-pitch distance thereby interlacing new trenches between the previously defined trenches. As a result, the first and second sub-pattern images are combined to produce the desired pattern in the $SiO_2$ film on the target layer, wherein the trenches are the spaces between the lines. However, the use of two etching steps to transfer the final desired pattern to a hard mask reduces the throughput of the lithographic process with respect to a single exposure process unless additional etch capacity at additional cost is provided.

SUMMARY

Embodiments of the invention may be used to ameliorate a lithographic multiple exposure process. A method consistent with the principles of the invention, as embodied and broadly described herein, provides for enhancement of image resolution in a lithographic system.

According to an aspect of the invention, there is provided a substrate constructed and arranged for being patterned using a lithographic process wherein the substrate is exposed to radiation, comprising a first layer of a positive tone resist at least partially overlying the substrate and a second layer of a positive tone developable material, with a pre-selected absorbance for the radiation, at least partially overlying the first layer, wherein the absorbance is arranged to; during exposure of the second layer to radiation, prevent exposure of at least a portion of the positive tone resist underneath the positive tone developable material to an exposure dose exceeding a fraction of an energy-to-clear exposure dose associated with the first layer, and to provide substantially complete photoactivation of the second layer.

According to an aspect of the invention, there is provided a method of forming a pattern of dense features of resist material on a substrate, including exposing the substrate to radiation traversing a patterning device, the substrate including a first layer of a positive tone resist at least partially overlying the substrate, the method comprising exposing a second layer of a positive tone developable material overlying at least part of the first layer to a first radiation pattern comprising semi-dense dark features in a bright background, the second layer having an absorbance higher than an absorbance of the first layer; developing the positive tone developable material to provide a pattern of features protruding from the first layer, the features separated by areas of uncovered first layer; exposing the uncovered first layer and the protruding features to a second radiation pattern comprising semi-dense dark features in a bright background, the dark features being positioned in interlaced relation with respect to the protruding features; and developing the positive tone resist to provide the pattern of dense features.

According to an aspect of the invention, the above described method includes the absorbance of the second layer being arranged to prevent, during exposing, an exposure of at least a portion of the positive tone resist underneath the positive tone developable material to an exposure dose exceeding a fraction of an energy-to-clear exposure dose associated with the first layer, and to provide substantially complete photo-activation of the second layer.

According to an aspect of the invention, there is provided a machine readable medium encoded with machine executable instructions for executing a method, the method comprising obtaining data for determining an absorbance to radiation of a second layer of a positive tone developable material to be disposed on a first layer of a positive tone resist, the first layer at least partially overlying a target layer of a substrate; determining a thickness of the second layer based on the data and in accordance with the absorbance to prevent exposure of at least a portion of the positive tone resist underneath exposed portions of the positive tone developable material during an exposure of the positive tone developable material to the radiation; and determining settings for a spin-coat device to apply the second layer based on the determined thickness.

According to an aspect of the invention, there is provided a lithographic system including a lithographic exposure apparatus, a spin-coat device capable of providing a layer of developable material to a substrate, and a controller configured to control the lithographic exposure apparatus and spin-coat device, wherein the controller comprises the machine readable medium according to an embodiment of the invention.

According to an aspect of the invention, there is provided a machine readable medium encoded with machine executable instructions for executing a method, the method comprising instructing a spin-coat device to apply a layer of a positive tone developable material over at least part of a layer of a positive tone resist at least partially overlying the substrate, the layer of positive tone developable material having an absorbance higher than an absorbance of the layer of positive tone resist; instructing the lithographic exposure apparatus to expose the layer of positive tone developable material to a first radiation pattern comprising semi-dense dark features in a bright background; instructing a substrate processing apparatus to develop the positive tone developable material to provide a pattern of features protruding from the layer of positive tone resist, the features separated by areas of uncovered layer of positive tone resist; instructing the lithographic exposure apparatus to expose the uncovered layer of positive tone resist and the protruding features to a second radiation pattern comprising semi-dense dark features in a bright background, the dark features being positioned in interlaced relation with respect to the protruding features; and instructing a substrate processing apparatus to develop the positive tone resist to provide a pattern of dense features.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

As noted above, their exists a desire to achieve finer optical resolutions and to circumvent the theoretical half-pitch lower limit $k_1$ of 0.25 for printing features using a multiple exposure process wherein avoiding the use of an intermediate etching step in between the multiple exposures would provide an advantage.

As described in greater detail below, an embodiment of the invention achieves resolutions lower than the half-pitch lower limit $p_{0.5}=k_1 \cdot \lambda/NA$ wherein $k_1 \geq 0.25$, thus circumventing the $k_1=0.25$ barrier, by implementing a dual exposure technique wherein use is made of a specially designed sandwich photoresist structure comprising a first layer for use to be patterned and to subsequently function as an etch mask and a second layer which substantially absorbs the exposure radiation and which has a thickness smaller than would be required for functioning as an etch mask. Further, an embodiment of the invention enables the exclusive use of positive tone resist for printing those features wherein the use of positive tone resist is desirable over the use of negative tone resist. Examples of such features are dense, semi dense and isolated lines.

In the manufacture of integrated circuits (ICs), a lithographic exposure apparatus is typically used, in which case a patterning device, such as a reticle, provides a circuit pattern corresponding to an individual layer of the IC. In photolithography, a beam of radiation is, upon traversing the patterning device, patterned by a pattern embodied, for example, as light absorbing pattern features (e.g. a chrome layer) on a transparent surface of the reticle. Subsequently, the patterned radiation beam is projected by a projection system of the lithographic apparatus onto a target portion (e.g., comprising one or more dies) on a substrate (such as, for example, a silicon wafer) that has been coated with a layer of photoresist material. An image of the pattern is formed by the projection system, and the resist material is exposed to the image. After development of the exposed resist, a desired pattern of resist features is obtained, which in turn can be used as an etch mask to transfer the desired pattern to a target layer underneath the resist.

The projected image of the patterning device pattern provides, at substrate level, a pattern of bright, exposed areas and dark, ideally unexposed but in practice substantially unexposed areas. The resist layer facing the exposure radiation is exposed to such a radiation pattern, and in the bright areas and due to the exposure to radiation, a photo active compound in the resist changes the solubility of the resist to developer (generally a resist developer is a basic, aqueous solution). This change of solubility from insoluble to soluble in a positive tone resist (and from soluble to insoluble in a negative tone resist) occurs, over the whole thickness of the resist layer, at a threshold value of the exposure dose, the so called energy-to-clear, hereinafter denoted by $E_o$.

In order to decrease the printable half pitch of dense features, the wavelength of the radiation used for exposure is chosen as small as possible (in accordance with Equation 1). Radiation sources generally used for projection lithography are i-line radiation emitting mercury arc lamps, KrF excimer lasers and ArF excimer lasers each providing radiation with a spectral peak at a wavelength of around respectively 365 nm, 248 nm and 193 nm.

Along with the introduction of radiation sources operating at shorter wavelengths, resists had to be developed for each of these radiation wavelengths which are substantially non-absorbing at the wavelength of the radiation to be used for exposure, since any substantial absorption of exposure radiation in a resist layer would prevent the radiation from activating the photo-active compound of the resist material over the whole thickness of the resist layer. In conventional lithography, the resist layer thickness exceeds a minimum thickness needed for a required etch resistance. However, when for example positive tone resist material is used, a too high absorption of exposure radiation could then cause an incomplete developing of an exposed area, leaving residual unexposed resist material in this area after the development of the resist. Hence, the problem of a too high absorbance for a resist layer to be used as an etch mask cannot be solved by merely reducing the thickness of the resist layer. Consequently, for use with lithographic processes based on exposing resist to a pattern image using i-line radiation of a mercury arc lamp, or deep ultra violet (DUV) radiation of respectively an KrF excimer laser and ArF excimer laser, respective substantially non-absorbing resists were developed. For i-line lithography, diazonaphthoquinone based resist materials are commonly used. These resists cannot be used with KrF lithography because of strong absorption of radiation of 248 nm wavelength in a layer of diazonaphthoquinone based resist material at sufficient thickness for etch resistance. With the transition to KrF lithography wherein lithography apparatus are used at 248 nm wavelength, chemically amplified resist materials came into use. A chemically amplified resist material features a sufficiently low absorbance for 248 nm radiation. Generally, chemically amplified resists for use with conventional KrF lithography are poly hydroxy styrene based resists. A critical component of chemically amplified resist materials is the photo-acid generator (referred to as PAG), which is the photo-active ingredient. The PAG produces acid upon irradiation. However, in order to achieve sufficient transmittance for radiation of 193 nm wavelength (to enable the use of the chemically amplified resist materials with ArF lithography) new PAG's, such as for example ionic PAG, were introduced and are still in development to further lower the absorbance of a corresponding resist layer at 193 nm wavelength radiation. Resists for use with conventional ArF lithography are acrylate and/or methacrylate based resists. Hereinafter, a resist type for conventional use with a specific radiation source, and as described above, will be referred to by the specific radiation source: thus, in the present text and claims reference may be made to i-line resist, KrF resist and ArF resist. It is appreciated that each of these resist types has an absorbance beyond tolerance when used (at the required layer thickness for functioning as an etch mask, which may typically be between 200 and 300 nm), with a radiation source operating at a shorter wavelength than the specific radiation source (examples of which are given above).

Figure 1:
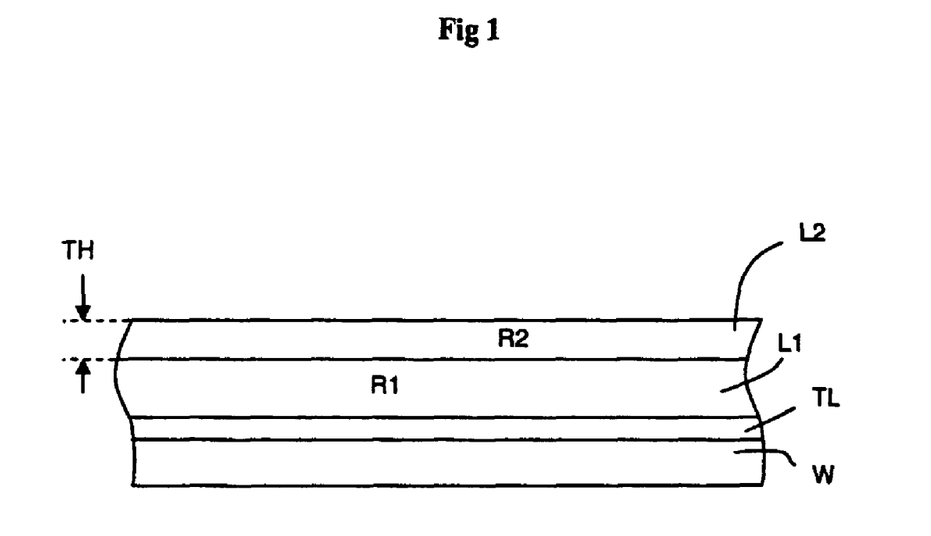
FIG. 1 illustrates a substrate prepared for use with the method described herein, the substrate provided with a target layer and two layers on top thereof.

According to an embodiment of the invention, and as illustrated in FIG. 1, there is provided a substrate W, which may carry previously processed IC layers, and which is provided, in the following order, with a target layer TL, a first layer L1 comprising a first resist material R1, having an energy-to-clear $E_{o1}$ and overlaying the target layer TL, and a second layer L2 comprising a second resist material R2 and overlying the first layer L1. Providing the layers may include applying pre-exposure processes such as for example cleaning, priming and soft-bake processes. To reduce back reflection of exposure radiation during exposure, the second layer L2 may further include a developable bottom anti reflex-coating to reduce back reflection of exposure radiation, and the first layer L1 may further include a bottom anti reflex coating or a developable bottom anti reflex coating. Both first and second layers L1 and L2 are to be exposed with radiation of one single type of radiation source. In the present embodiment, the multiple exposure process is executed using a lithographic exposure apparatus comprising an ArF excimer laser as radiation source, the first resist material R1 is an ArF resist, and the second resist material, a material highly absorbent of ArF excimer laser radiation, is a KrF resist. It is appreciated that embodiments of the invention are not limited to providing and using a stack of ArF and KrF resist layers. For example, the ArF resist layer can be covered by an i-line resist layer (instead of the KrF resist layer); i-line resist is also highly absorbent for ArF excimer laser radiation.

The thickness of the first layer L1 is such that, after exposure (to a pattern of radiation as projected on the first layer L1) and development, it can serve as an etch mask for transfer of the pattern in the developed layer to the target layer TL by means of dry etching. According to an aspect of the invention, the thickness TH2 of the second layer L2 is merely chosen such that it is photoactivated throughout its thickness in exposed areas, while at the same time preventing exposure of the first resist material R1 to an exposure dose greater than the energy-to-clear $E_{o1}$ associated with the first layer L1. In an embodiment, the thickness TH2 of the second layer L2 is chosen such that it only allows exposure of the first resist material R1 to an exposure dose up to only a fraction of the energy-to-clear $E_{o1}$. In an embodiment, the fraction may be a number smaller than 0.5. Then, after development of the first layer L1, still a sufficient etch resistance is provided for portions of the first layer L1 serving as an etch mask. It is appreciated that there is no requirement that the second layer L2 shall function as an etch mask.

The second resist material R2 being, in the present embodiment, a KrF resist, strong absorption of ArF excimer laser radiation will occur upon exposure, so that—in the absence of the conventional etch mask function of a patterned resist layer—the thickness TH2 typically can be chosen to be smaller than the thickness of the first layer L1.

According to an aspect of the invention, and in view of the fact that with an embodiment of the invention there is no requirement that the patterned second layer L2 function as an etch mask, the material of the second layer L2 can be any suitable positive tone developable material which provides the second layer L2 with the desired absorbance.

Figure 2:
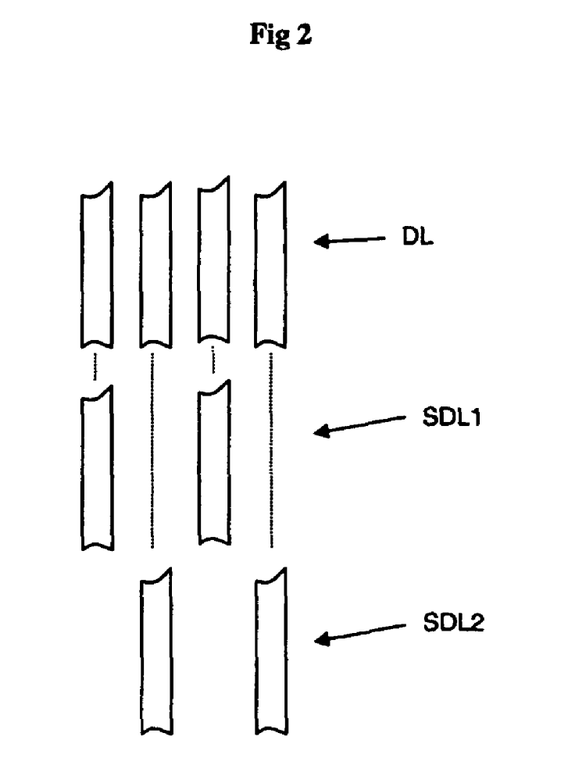
FIG. 2 illustrates the decomposition of a dense pattern which is beyond lithographic resolution into two semi dense patterns which each are within lithographic resolution according to an embodiment of the invention.

As schematically illustrated in FIG. 2, the desired pattern to be printed, using a lithographic exposure apparatus, comprises, for example, a set DL of dense features (e.g., lines). Conventionally, a patterning device (such as a reticle) carrying a corresponding pattern of dense features is imaged at a 4 or 5 times reduction on the resist layer covering the substrate.

According to an embodiment of the invention, the features DL are decomposed into two constituent sub-patterns, embodied as corresponding patterns SDL1 and SDL2 of semi-dense features that are capable of being optically resolved by the lithographic apparatus. It is appreciated that on the patterning device surface carrying the pattern, the features may be embodied as, for example, features of a chrome layer of a Chrome on Glass reticle, or of a Mo—Si layer of an attenuated phase shift reticle, or as a transparent, 180-degree phase shifting edge of an alternating phase shift reticle, or as two or more of such phase shifting edges (separated at a distance smaller than the resolution limit of the lithographic apparatus). Further, the features DL may be decomposed into more than two constituent sub-patterns and accordingly, more than two exposures may be used.

It is appreciated that embodiments of the invention are not limited to the use of a projection system operating at a 4 or 5 times reduction ratio; for simplicity it is hereinafter assumed that (and the figures are set up as if) the printing process is run at unit reduction ratio. According to an aspect of the invention, features of resist layer material in accordance with the sub patterns SDL1 and SDL2 are provided to the target layer TL (and hence protruding from the target layer surface) by subsequently imaging the patterns in interlaced position relative to each other, on the substrate surface, as described in more detail below.

Figure 3:
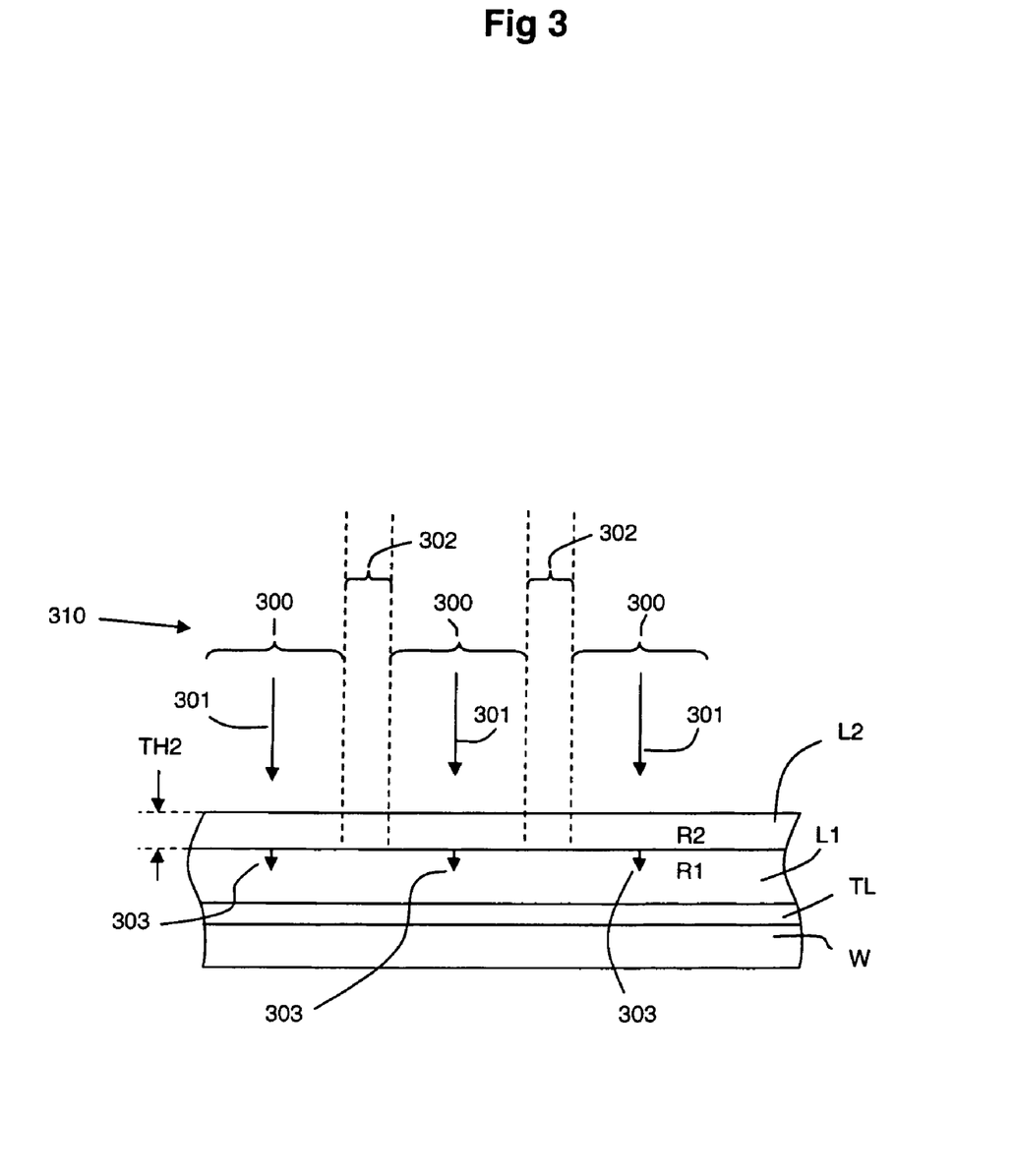
FIG. 3 illustrates the first exposure to a first radiation pattern representing semi dense dark features and bright spaces according to an embodiment of the invention.

After providing the substrate to a lithographic projection apparatus, the substrate is subjected to a first exposure process wherein the second layer L2 is exposed to an image 310 of the sub-pattern SDL1, as illustrated in FIG. 3.

The image 310 comprises bright areas of exposure 300, wherein the length of the arrows 301 schematically indicates the magnitude of the exposure dose $E_{in}$ applied to the second layer L2 in these areas. The image intensity pattern 310 further comprises dark areas 302 corresponding to features of the first sub-pattern SDL1, where the second layer L2 remains unexposed. Due to absorption of exposure radiation in the second layer L2, exposure of the first resist R1 is substantially avoided; in particular exposure to an exposure dose greater than the energy-to-clear $E_{o1}$ is avoided. The first layer L1 underneath the areas of exposure 300 will in principle be exposed to an exposure dose which is leaking through the absorbing second layer L2 during exposure. This exposure dose is referred to as the leakage dose, and is denoted by $E_{out}$. The leakage of exposure dose is schematically indicated by the arrows 303 in FIG. 3; the length of the arrows 303 schematically indicates the magnitude of the leakage dose $E_{out}$. The leakage dose $E_{out}$ leaking through layer L2 is related to the exposure dose $E_{in}$ of the first exposure according to:

$$E_{out}=E_{in} \cdot 10^{-A}, \qquad (2)$$

where A is the absorbance of the second layer L2. To avoid exposure to an exposure dose greater than the energy-to-clear $E_{o1}$, the thickness of the second layer L2 is chosen such that A>Ao, where Ao is the absorbance of the second layer L2 at which $E_{out}=E_{o1}$, thus where the equation $$E_{o1}=E_{in} \cdot 10^{-Ao}, \text{ or}$$

$$Ao=-\log(E_{o1}/E_{in}) \qquad (3)$$

is satisfied.

In an embodiment (to maintain sufficient thickness of the first layer L1 after developing that layer in a subsequent process step described below) the leakage dose $E_{out}$ is arranged to be a fraction x of the energy-to-clear $E_{o1}$ by choosing the thickness TH2 of the second layer L2 such that A>A$_x$, where A$_x$ is the absorbance of the second layer L2 at which $E_{out}=x \cdot E_{o1}$, with x<0.5:

$$A_x=-\log(x \cdot E_{o1}/E_{in}) \qquad (4)$$

is satisfied.

The absorbance A of the second layer L2 is to good approximation linearly proportional to the thickness TH2. For example, the absorbance may be modeled as follows:

$$A=\epsilon \text{ TH2 c} \qquad (5)$$

where $\epsilon$ is the molar absorptivity of the PAG, and c the concentration of the PAG.

Further, the thickness TH2 of the second layer L2 is chosen such that it is photoactivated throughout its thickness in exposed areas.

Figure 4:
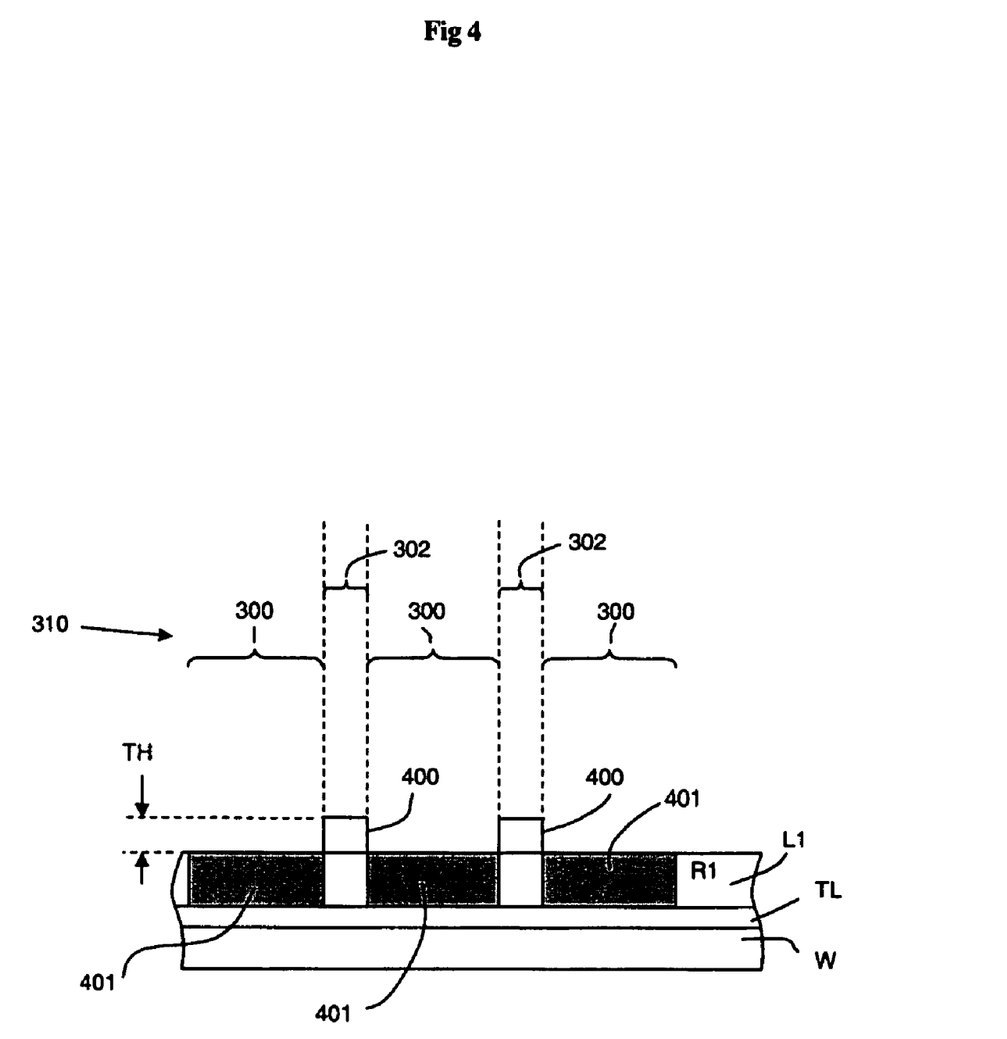
FIG. 4 illustrates the effect of the first exposure and a subsequent development of resist.

In the present embodiment, after the first exposure, the exposed second resist material R2 is removed by a first resist development process. As schematically illustrated in FIG. 4, unexposed second resist material R2 remains and hence a mask of features 400 (e.g., line shaped) of second resist material R2 corresponding to the features of the first sub pattern SDL1 is obtained on the first layer L1. The features 400 are protruding from the first layer L1. After applying the first exposure and before applying the first resist development process, the substrate may or may not (depending on the material properties of the second resist material R2) be subjected to post-exposure processes such as for example a Post Exposure Bake (PEB) and/or a hard bake. If the substrate is subjected to, for example, a Post Exposure Bake (PEB) and/or a hard bake, an effect of these steps on the first resist material R1 may be compensated for by adjusting the exposure dose of a second exposure (described below). The spaces between the features 400 of unexposed second resist material R2 define areas 401 in the first layer L1 where the first resist material R1 has been exposed to the leakage dose $E_{out}$ (an exposure dose desirably well below energy-to-clear $E_{o1}$). The below energy-to-clear exposure of the areas 401 is indicated in FIG. 4 by the gray filling of the areas 401. Thus, after the first exposure, the first resist material R1 has either been exposed below energy-to-clear $E_{o1}$, or it has not been exposed (in accordance with the dark areas of the image 310, and ignoring any insubstantial exposure such as exposure to stray radiation).

Figure 5:
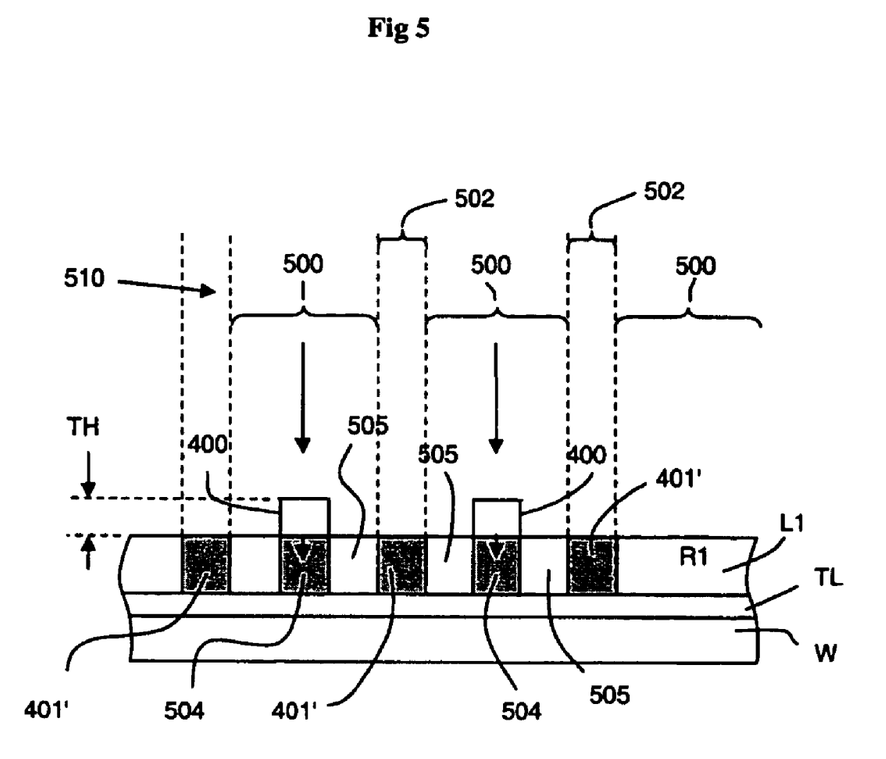
FIG. 5 illustrates the second exposure to a radiation pattern representing, in interlaced position with respect to the first radiation pattern, semi dense dark features and bright spaces according to an embodiment of the invention.

According to the present embodiment, and as illustrated in FIG. 5, the first layer L1 and the features 400 of unexposed second resist material R2 are exposed, during a second exposure process, to a pattern 510 of ArF excimer laser exposure radiation in accordance with the second sub pattern SDL2, comprising dark semi dense features 502 embedded in bright background areas of exposure 500. The pattern 510 is an image of the second sub pattern SDL2, also referred to hereinafter as the second image, and is located with respect to the features 400 such that the bright areas of the image 510 are positioned in interlaced position with respect to the features 400. So, the features of the pattern SDL2 are positioned in between the previously obtained features 400. In the areas corresponding to the bright spaces 500 between the dark features 502 of the second image 510, the absorbance of the KrF resist features. 400 prevents exposure of first resist material R1 underneath these features to a dose above energy-to-clear $E_{o1}$. Where, in view of the previous exposure, the thickness TH2 of the second layer L2 was chosen (as described above) such that it allows exposure of the first resist R1 to an exposure dose up to only a fraction (e.g.0.5 or less) of the energy-to-clear $E_{o1}$, the absorbance of the KrF resist features 400 in this exposure as well prevents a too high exposure of first resist material R1 underneath these features in the same way and substantially under the same physical circumstances.

The process of exposure dose leaking through the KrF resist material features 400 is the same as the exposure dose leakage process during the first exposure, i.e., it is governed by substantially the same physical conditions such as Equations 1-5. This is schematically indicated by the larger and smaller vertical arrows in FIG. 5, corresponding to the respective arrows 301 and 303 in FIG. 3. Thus, the resulting exposure of the first resist material R1 underneath the features 400 is substantially the same as the below energy-to-clear exposure to radiation that had occurred before start of the second exposure in the dark areas 502. In analogy with the areas 401, this is indicated by the gray filled areas 401' (corresponding to the dark features 502) and 504 (underneath the features 400) in FIG. 5. The first resist material R1 is fully exposed to an exposure dose $E_{in}$ in the areas 505 between the areas 401' and 504.

Figure 6:
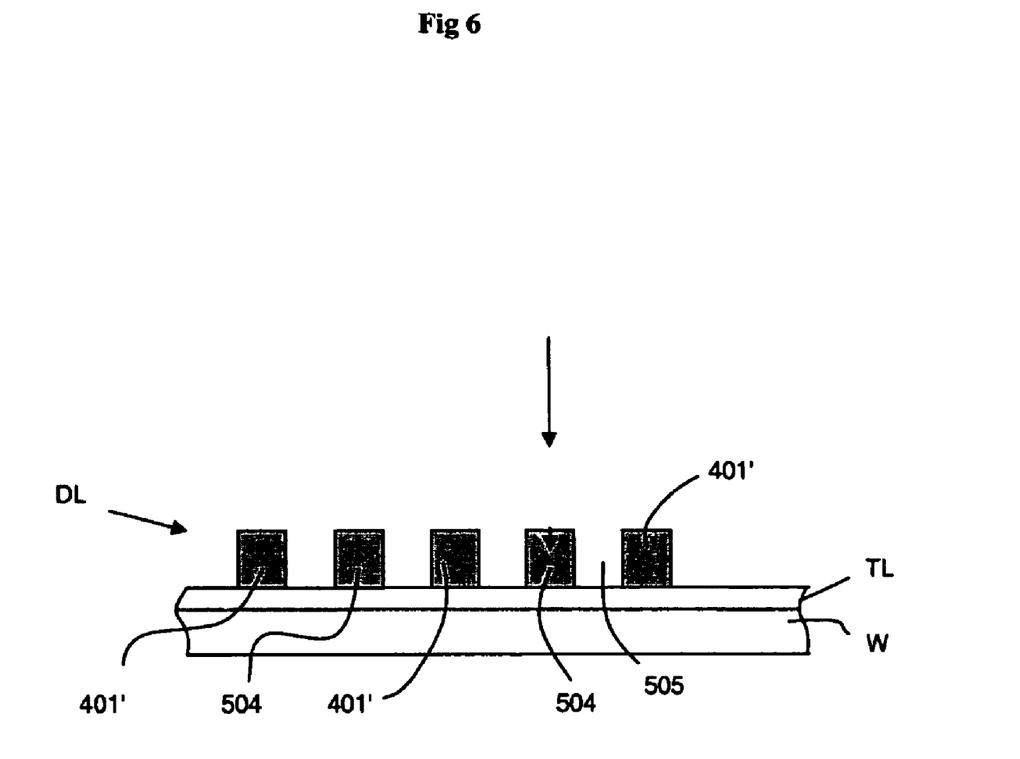
FIG. 6 shows a resist mask in accordance with a desired dense pattern of features according to an embodiment of the invention.

In the present embodiment, after the second exposure, the resist material features 400 and the exposed first resist material R1 in the areas 505 are removed by applying a second resist development process. Unexposed first resist material R1 and/or first resist material R1 exposed below energy-to-clear $E_o$, as described above, remains. Hence, on the target layer TL, an etch mask of features of first resist material R1, corresponding to the features of the desired pattern DL and protruding from the surface 600 of the target layer, is obtained as indicated in FIG. 6. After the second exposure, the substrate may again be subjected to post-exposure processes such as a Post Exposure Bake (PEB) and/or a hard bake.

The pattern of resist material features can be used as an etch mask for the transfer of the desired pattern DL to the target layer TL using, for example, conventional reactive ion etching. Such a final transfer of the pattern to the target layer TL may, for example, involve an etching using a dry etching chamber, suitable for reactive ion etching. An advantage of reactive ion etching, also referred to as RIE, is that it is a non-isotropic, directionally selective etch process, whereas wet etching is an isotropic etch process (causing undercut of features).

As further illustrated in FIG. 6 by the similar gray filling of the areas 401' and 504, the exposure to radiation (below energy-to-clear) of the resist features is the same for the features of the sub patterns SDL1 and SDL2, provided that the exposure dose $E_{in}$ for the first and second exposure processes is substantially the same. Hence, to the extent that exposure to such a below energy-to-clear exposure dose has an effect on, for example, etch resistance, or an etching-bias, this effect is uniformly distributed over the features of the patterning device pattern, thereby providing process uniformity.

According to an aspect of the invention, the leakage dose $E_{out}$ is a fraction x of the energy-to-clear $E_{o1}$ in which case the leakage dose $E_{out}$ equals, in the first and second exposure of the present embodiment, a threshold dose wherein only a layer-shaped portion of the first resist material of first layer L1, the layer-shaped portion facing the exposure radiation, becomes soluble. Consequently, during the exposures, that layer-shaped portion. (or "upper section") of the first layer L1 is exposed above development threshold and will be developed away during the application of the respective first and second development processes. Due to residual absorption of exposure radiation in the ArF resist layer L1, the effect of exposure to above the threshold dose remains limited to the layer-shaped upper section, so that the absorbance A still prevents exposure to above the threshold dose of at least a portion of the first resist material R1 underneath exposed areas during exposing the second layer L2 and underneath the features 400 during exposing the first layer L1 and the features 400. Since again both the exposure in the layer shaped upper section and in the portion of the first layer L1 underneath the upper section are governed by substantially the same physical conditions during the exposures, any effect on etch resistance, or on an etching-bias, is uniformly distributed over the features of the patterning device pattern, thereby maintaining above mentioned process uniformity.

An aspect of the invention is that the method is suitable for printing dense and semi dense lines (or substantially line-shaped features or elongated features, desirably at critical dimension) because the method involves the use of positive tone resist for the first and second exposure. An imaging process for printing lines is of optimal quality when imaging dark lines against a bright background. With an embodiment of the invention this optimal quality can be obtained by using positive resist with the lithographic processes for printing the line features of the resist masks formed in the first and second layers L1 and L2.

The lithographic exposure apparatus used for printing the features generally comprises a support structure constructed to support a patterning device (e.g., a reticle), and a substrate table (e.g., a wafer table) constructed to hold the substrate W. The lithographic exposure apparatus may be of a type having two (dual stage) or more substrate tables (and/or two or more patterning device support structures). In such "multiple stage" machines the additional tables (and/or support structures) may be used in parallel, or preparatory steps may be carried out on one or more tables (and/or support structures) while one or more other tables (and/or support structures) are being used for exposure. Residual placement errors during e-beam writing of the patterning devices for the patterns SDL1 and SDL2 can be monitored and in a dual stage lithographic projection system these residual errors can be compensated for when the dual stage apparatus is used in a mode of operation wherein the scanner "remembers" the substrate chuck used for the first exposure and dedicates the same substrate chuck for the second exposure. This mode of operation will be referred to hereinafter as the chuck-dedication-mode. As a result, in the chuck-dedication-mode, the substrate stepping grid and the substrate table chucking induced distortions fingerprints will be the same for the first and second exposures. This reduces non-correctable higher order overlay errors between these exposures. In addition, the low order e-beam writer's pattern placement errors, e.g., linear offsets and magnification errors, between two patterning devices can be compensated in the scanner by using the appropriate alignment compensations for the substrate stage and the patterning device stage. In the chuck-dedication-mode the overlay performance with the present multiple exposure process is comparable to, or even better than, the e-beam writer's placement accuracy.

An aspect of the invention is that features are printed, instead of spaces. Alignment errors between the multiple exposures do not affect the resulting printed feature width, but only the spaces between the features, which is generally less critical to, for example, transistor performance. A placement error between the sub-patterns SDL1 and SDL2, i.e., the overlay consistency between the exposures of the multiple exposure process, has no effect on the printed critical dimension of the resulting features. This placement error can be of the order of the placement error as occurring during the patterning device writing process. By using positive resist with the lithographic processes for printing the features of the patterns SDL1 and SDL2, any overlay error of the patterns SDL1 and SDL2, and hence also of the resulting pattern DL, with respect to a pattern which was previously formed on the substrate W is the same as would have been obtained with a single exposure process. In other words, the resulting alignment accuracy of the pattern DL in the target layer TL with respect to a reference on the substrate W directly corresponds to the alignment accuracy obtainable with a single-exposure process.

Due to any non-linearity of the response of a photoresist layer to either development and/or exposure, the spatial Fourier transformation of the resist-mask of features 400 corresponding to the sub-pattern SDL1 contain higher spatial frequencies than the spatial Fourier transformation of the intensity pattern of the image of the sub-pattern SDL1. The first exposure and development of the second resist material R2 fixes the first sub-pattern image in the second layer L2, and the features 400 of second resist material R2 act as a contact mask during the second exposure, thus preventing a cross talk or a merging of the sub-pattern images corresponding to the patterns SDL1 and SDL2. Therefore, also the spatial Fourier transformation of the combined pattern DL as transferred to the target layer (using the features on the surface 600 as an etch mask) contains spatial frequencies higher than corresponding to the inverse of a half pitch $p_{0.5} = k_1 \cdot \lambda / NA$ wherein $k_1 \geq 0.25$, which enables the circumvention of the $k_1 = 0.25$ barrier.

According to an aspect of the invention, the target layer TL may either be a device layer (such as a doped polysilicon layer) or a hard mask layer which is to act as an etch mask.

According to an embodiment, neither a deposition of a hard mask layer nor an etching of a hard mask layer between the multiple exposures is needed. Instead, the present exposure and feature printing method in principle only uses conventional aqueous development steps, one between the multiple exposures, and one after the last exposure. Consequently, the present method can easily be implemented in a lithographic system comprising the lithographic apparatus and a coat/develop track that is typically linked to the lithographic apparatus.

Figure 7:
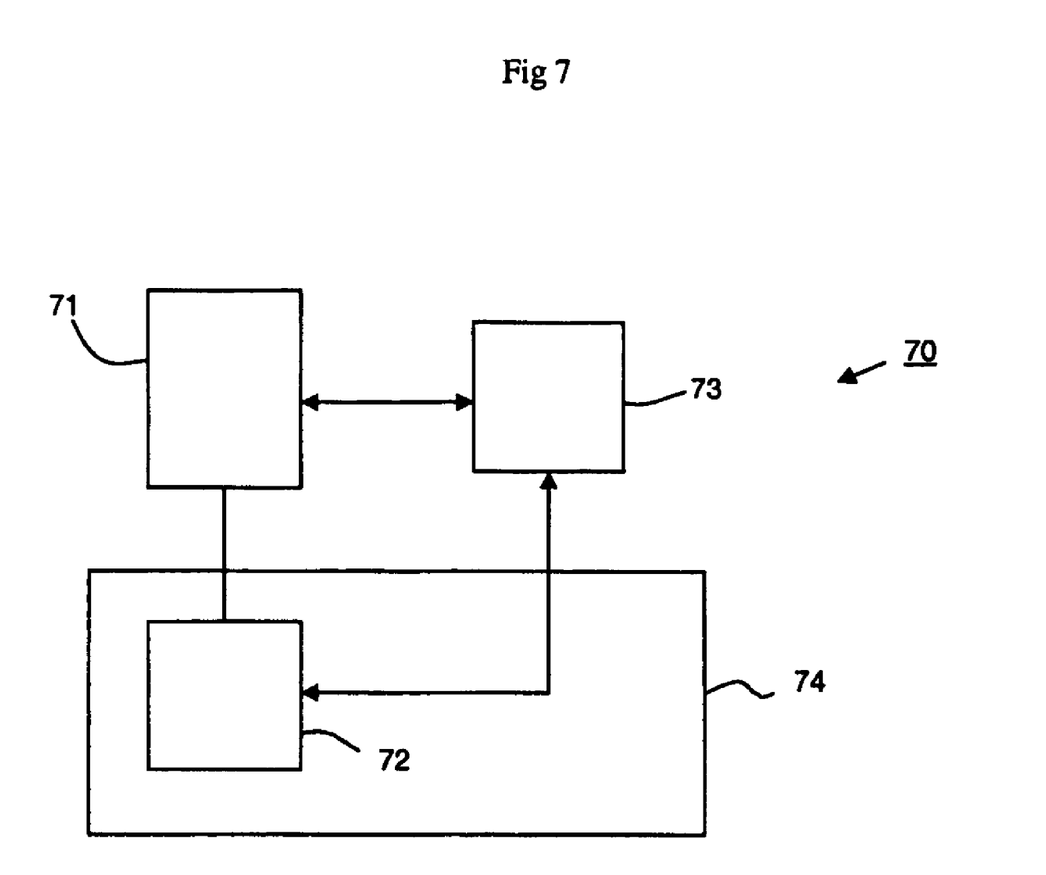
FIG. 7 illustrates a lithographic cluster according to an embodiment of the invention.

A lithographic system suitable for use with conventional multiple exposure processes generally comprises a plurality of resist development devices and substrate coating devices, such as a spin-coat device configured to apply a resist layer onto the substrate. According to an aspect of the invention, and as illustrated in FIG. 7, a lithographic system 70 comprises, besides a lithographic exposure apparatus 71, a spin-coat device 72 capable of providing to the substrate the second layer L2, and a controller 73 configured to control the lithographic exposure apparatus and the spin-coat device. The spin-coat device may be arranged to provide a resist layer of a pre-selected thickness to the substrate, wherein this process is fully automated and run under computer control. The thickness of the resist layer as applied by the spin-coat device is controlled by a number of parameters comprising, for example, the rotation speed used for spin-coating, the temperature of the resist material, the amount of resist material applied to the substrate during spin-coating, and the viscosity of the resist material.

One or more spin-coat devices may be used to respectively apply the first and layers L1 and L2.

Figure 8:
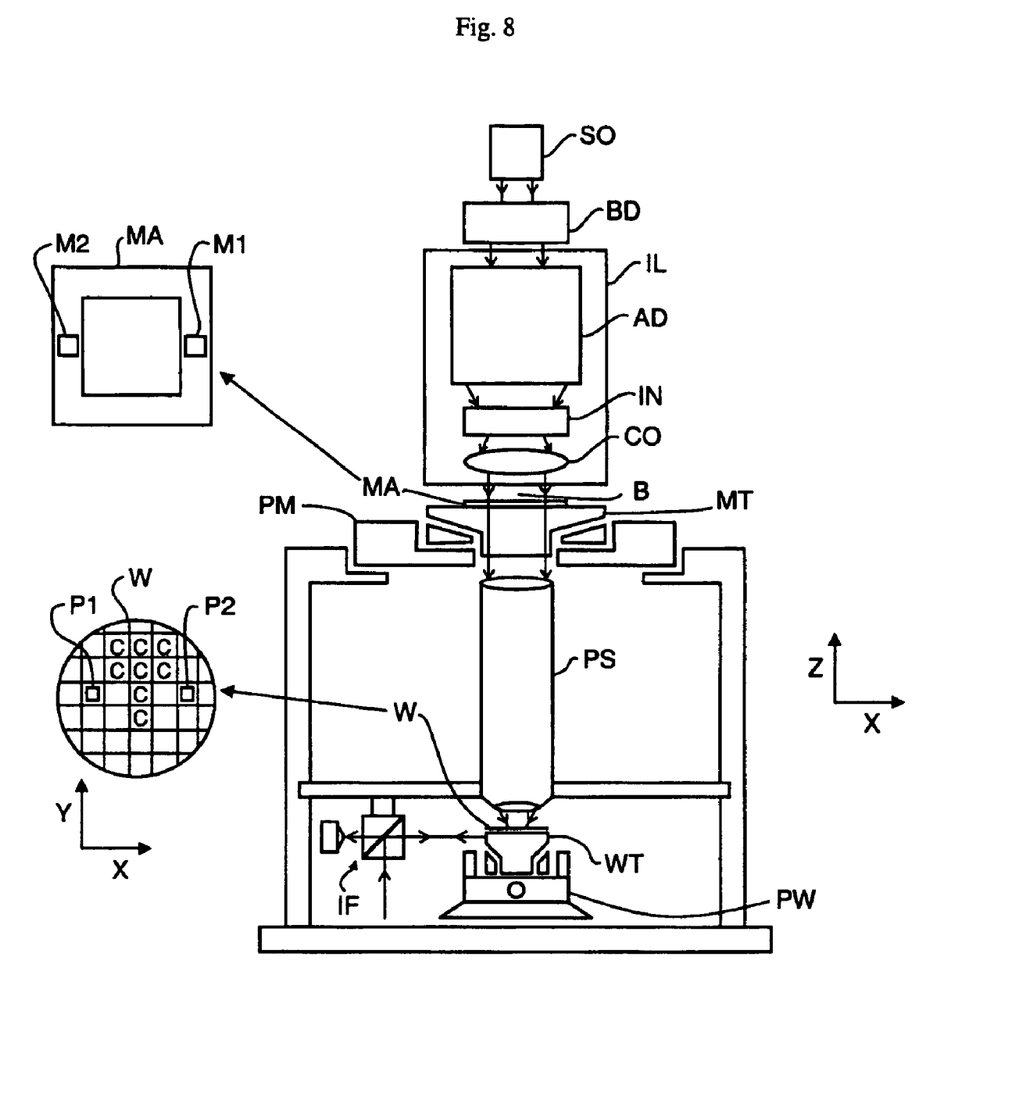
FIG. 8 depicts a lithographic apparatus according to an embodiment of the invention.

A lithographic exposure apparatus according to an embodiment of the invention is schematically depicted in FIG. 8. The apparatus comprises:

an illumination system (illuminator) IL configured to condition a radiation beam B (e.g., UV radiation or DUV radiation such as for example generated by an excimer laser operating at a wavelength of 193 nm or 157 nm, or EUV radiation generated by a laser-fired plasma source operating at 13.6 nm);

a support structure (e.g., a reticle table) MT constructed to support a patterning device (e.g., a reticle) MA and connected to a first positioner PM configured to accurately position the patterning device in accordance with certain parameters;

a substrate table (e.g., a wafer table) WT constructed to hold a substrate (e.g., a resist-coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure may be a frame or a table, for example, which may be fixed or movable as required. The support structure may ensure that the patterning device is at a desired position, for example with respect to the projection system. Any use of the terms "reticle" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit. The patterning device may be transmissive or reflective.

The term "projection system" used herein should be broadly interpreted as encompassing any type of projection system, including refractive or reflective, and catadioptric optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive patterning device). Alternatively, the apparatus may be of a reflective type (e.g., employing a reflective patterning device).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 8, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., reticle) MA, which is held on the support structure (e.g., reticle table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 8) can be used to accurately position the patterning device MA with respect to the path of the radiation beam B, e.g., after mechanical retrieval from a patterning device library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e., a single dynamic exposure). The velocity and direction of the substrate table WT relative to the support structure MT may be determined by the (de-)magnification and image reversal characteristics of the projection system PS; In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

According to an aspect of the invention, the lithographic system comprises, as a lithographic exposure apparatus, a lithographic interferometry apparatus. In such an apparatus, a resist layer is exposed to a fringe pattern obtained in a multiple beam interferometric apparatus. For example, two collimated beams of UV or DUV radiation intersect each other at an angle to produce linear interference fringes. A substrate having a photosensitive layer is positioned on a movable table. The table is arranged to be rotated and translated in two-dimensions respectively. Two substantially collimated coherent optical beams provided by any suitable well known source or sources are directed at a variable angle from the normal vector associated with the substrate toward each other and toward the photoresist layer to form an interference pattern on the photosensitive layer. The interfering radiation beams of coherent radiation may be generated by, for example, an ArF excimer laser using a beam splitting element, and may be provided in any suitable well known manner so that they are from the same source and are essentially equal in intensity at the substrate which assures a high contrast exposure.

The interference pattern produced on the photoresist layer or layers may be varied by, for example, rotating the substrate and/or translating the substrate.

The controller 73, see FIG. 7, according to an embodiment of the invention may comprise a memory into which data can be stored which concern the sub-patterns SDL1 and SDL2 and which are used to control the lithographic exposure apparatus 71 (such as, for example, settings concerning positioning of the support structure MT and substrate table WT, and/or settings concerning illumination modes) during each of the exposures required to generate the combined pattern DL. The same memory can be used to store data concerning the settings of the spin-coat device 72 used to provide the second layer L2 to the substrate W in accordance with an embodiment of the invention. A computer which may be part of the control device is programmed and arranged to execute, based on the data stored in the memory, any of the method steps according to an embodiment of the invention.

Figure 9:
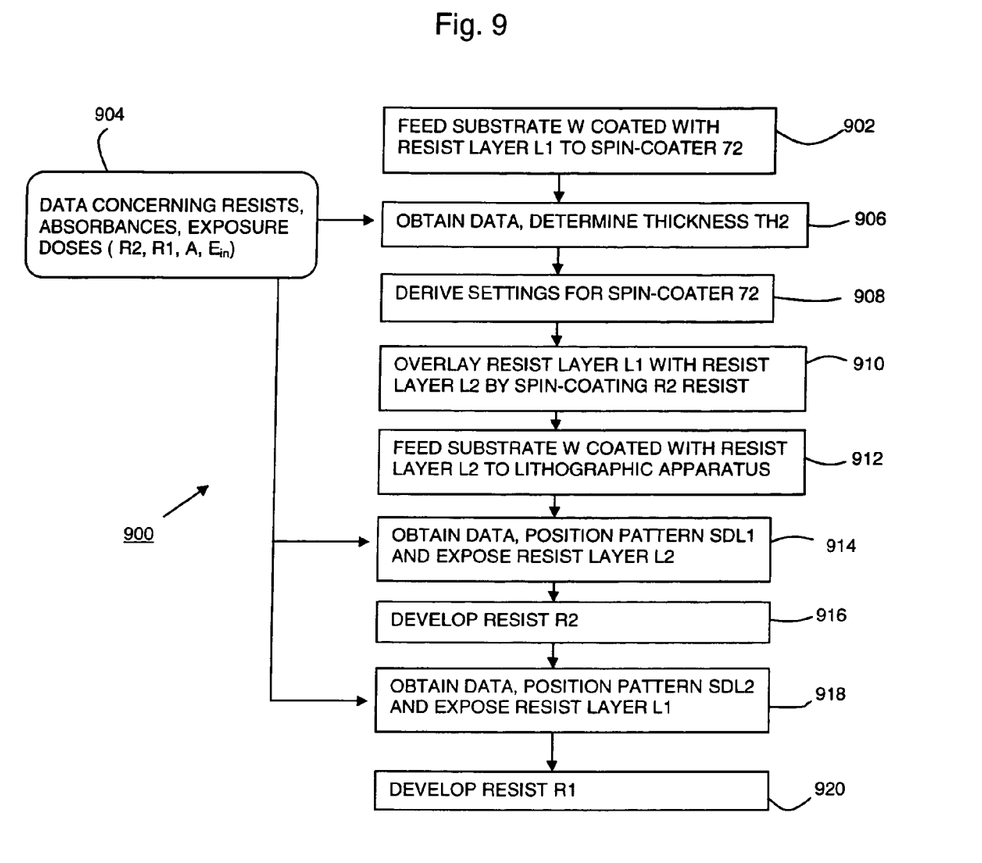
FIG. 9 shows a flow scheme of a multiple exposure method according to an embodiment of the invention.

FIG. 9 illustrates the method steps 900 according to an embodiment of the invention. The execution of the steps involves running a computer program on the computer, the computer program containing one or more sequences of machine-readable instructions describing any of the methods as disclosed above. The computer contains a machine readable medium (e.g., semiconductor memory, magnetic or optical disk) having such a computer program stored therein.

According to an aspect of the invention, the machine readable medium is encoded with machine executable instructions to cause execution of a method of patterning a substrate according to the steps 900. A substrate W provided with a target layer TL and the first layer L1 is provided (step 902) to the spin-coat device, which may involve a substrate handler transporting the substrate from the lithographic exposure apparatus 71 to the spin-coat device 72. Next, in step 906, the required thickness TH2 of the second layer L2 such that the absorbance A prevents exposure to above energy-to-clear exposure dose $E_o$ of at least a portion of the first resist material R1 underneath exposed areas 301 during exposing the second layer L2 (and underneath the features 400 during exposing the first layer L1 carrying the features 400) is determined.

For that purpose, data 904 comprising data concerning the first and second resist materials R1 and R2, data concerning the respective absorbances such as parameters E (the molar absorptivity of the PAG) and c (the concentration of the PAG), and data concerning the first and second exposures are obtained. The latter data may involve the properties of the patterns SDL1 and SDL2, such as the type of patterning device and a critical dimension bias, as well as exposure doses to be applied.

The determination of the thickness TH2 in step 906 may, for example, involve calculating absorbances and applying Equations 1-5. The determination may include calculating a minimum thickness value for TH2, based on, for example, a pre-given absorptivity of the second resist material R2, wherein exposure of the first resist material R1 to an exposure dose up to only a fraction of the energy-to-clear $E_{o1}$ is safeguarded. In an embodiment, the fraction may be a number smaller than 0.5.

The determination may further include calculating a maximum thickness value for TH2, based on, for example, a pre-given absorptivity of the second resist material R2, wherein the requirement that the second layer L2 is photoactivated throughout its thickness in exposed areas is fulfilled. Alternatively, look-up tables of absorbance values may be used. In step 908 the settings for the spin-coater are determined, based on the results of the determination step 906, and in step 910 these settings are applied to the spin-coater, so that the first layer L1 can be properly covered with the second layer L2 in accordance with an embodiment of the invention.

Next, the substrate is transported to the lithographic apparatus 71 (step 912) which again may involve the use of substrate handler and transporting devices. In step 914, the first exposure is executed in accordance with the present embodiment, and the first resist development process is applied in step 916. Similarly, in steps 918 and 920, the second exposure and the second resist development process are executed. The data 904 may further comprise sub-pattern overlay data and positioning data for patterning devices with the patterns SDL1 and SDL2 respectively. Therefore, this data may be obtained and used in steps 914 and 918 so that, during the second exposure, the second sub-pattern SDL2 is exposed in juxtaposed registry with respect to the first sub-pattern SDL1 (in accordance, for example, with FIG. 2) to provide a resist-mask patterned in accordance with the desired pattern as illustrated in FIG. 6. After execution of step 920, the desired pattern of features on surface 600 is obtained.

Another embodiment of the invention is the same as the embodiment of the invention described above with respect to FIGS. 1-9, except for the choice of second resist material R2. In this embodiment, the second resist material R2 is i-line resist, which just as KrF resist absorbs radiation of 193 nm wavelength. Alternatively, the second resist material R2 comprises a positive tone resist different from i-line resist or KrF resist and with sufficient absorption for 193 nm radiation to provide an absorbance to the second layer L2 in accordance with an embodiment of the invention, analogously to as described above.

A further embodiment of the invention is the same as the embodiment of the invention described above with respect to FIGS. 1-9, except for the radiation source and for the choice of the first and second resist materials R2 and R1 as a combination. In this embodiment, the first resist material R1 is KrF resist, and the source SO is a KrF excimer laser. The second resist material R2 may, for example, be an i-line resist. Alternatively, the second resist material R2 comprises a positive tone resist different from i-line resist and with sufficient absorption for 248 nm radiation to provide an absorbance to the second layer L2 in accordance with an embodiment of the invention, analogously to as described above.

Similarly, in a further embodiment, the radiation source SO is an i-line mercury arc lamp and the first resist material R1 is an i-line resist. The second resist material R2 in the present embodiment is a positive tone resist with sufficient absorption for i-line radiation to provide an absorbance to the second layer L2 in accordance with an embodiment of the invention, analogously to as described above.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

The invention claimed is:

1. A method of forming a pattern of dense features of resist material on a substrate, including exposing the substrate to radiation, the substrate including a first layer of a positive tone resist at least partially overlying the substrate, the method comprising:

exposing a second layer of a positive tone developable material overlying at least part of the first layer to a first radiation pattern comprising semi-dense dark features in a bright background, the second layer having an absorbance higher than an absorbance of the first layer;

developing the positive tone developable material to provide a pattern of features protruding from the first layer, the features separated by areas of uncovered first layer;

exposing the uncovered first layer and the protruding features to a second radiation pattern comprising semi-dense dark features in a bright background, the dark features being positioned in interlaced relation with respect to the protruding features; and developing the positive tone resist to provide the pattern of dense features;

wherein the absorbance of the second layer is arranged to prevent, during exposing, an exposure of at least a portion of the positive tone resist underneath the positive tone developable material to an exposure dose exceeding a fraction of an energy-to-clear exposure dose associated with the first layer, and to provide substantially complete photoactivation of the second layer.

2. The method according to claim 1, wherein the fraction of the energy-to-clear exposure dose associated with the first layer is smaller than 0.5.

3. The method according to claim 1, wherein the radiation is ArF excimer laser radiation and the positive tone resist comprises an ArF resist or a acrylate/methacrylate based resist.

4. The method according to claim 1, wherein the positive tone developable material is a positive tone resist different from the positive tone resist of the first layer.

5. The method according to claim 4, wherein the radiation is ArF excimer laser radiation and the positive tone resist of the first layer comprises an ArF resist or an acrylate/methacrylate based resist and wherein the positive tone resist of the second layer comprises an i-line resist or a diazonaphthoquinone based resist or a KrF resist or a poly hydroxy styrene based resist.

6. The method according to claim 4, wherein the radiation is KrF excimer laser radiation and the positive tone resist of the first layer comprises a KrF resist material or a poly hydroxy styrene based resist and wherein the positive tone resist of the second layer comprises an i-line resist or a diazonaphthoquinone based resist.

7. The method according to claim 1, wherein the dense features comprise dense line-shaped features.

8. The method according to claim 1, further comprising providing the second layer of positive tone developable material to the first layer.

* * * * *